US009003256B2

(12) United States Patent
Lai et al.

(10) Patent No.: US 9,003,256 B2
(45) Date of Patent: Apr. 7, 2015

(54) SYSTEM AND METHOD FOR TESTING INTEGRATED CIRCUITS BY DETERMINING THE SOLID TIMING WINDOW

(75) Inventors: Bosco Chun Sang Lai, Markham (CA); Sunny Lai-Ming Chang, Markham (CA)

(73) Assignee: Kingtiger Technology (Canada) Inc., Markham, On (CA)

( * ) Notice: Subject to any disclaimer, the term of this patent is extended or adjusted under 35 U.S.C. 154(b) by 281 days.

(21) Appl. No.: 13/605,404

(22) Filed: Sep. 6, 2012

(65) Prior Publication Data

US 2013/0058178 A1 Mar. 7, 2013

Related U.S. Application Data

(60) Provisional application No. 61/531,309, filed on Sep. 6, 2011.

(51) Int. Cl.
*G01R 31/28* (2006.01)
*G06F 11/00* (2006.01)
*G11C 29/50* (2006.01)
*G11C 5/04* (2006.01)
*G01R 31/317* (2006.01)

(52) U.S. Cl.
CPC .......... *G11C 29/50012* (2013.01); *G11C 5/04* (2013.01); *G01R 31/31726* (2013.01)

(58) Field of Classification Search
CPC ........ G11C 5/04; G11C 11/401; G11C 29/56; G11C 29/56012; G11C 29/50012; G01R 31/31726

USPC ........ 714/744, 738, 724; 324/759.01, 762.02; 326/16; 365/201; 716/108, 113, 136
See application file for complete search history.

(56) References Cited

U.S. PATENT DOCUMENTS

| | | | |
|---|---|---|---|
| 4,379,259 A | 4/1983 | Varadi et al. |
| 4,484,329 A | 11/1984 | Slamka et al. |
| 4,821,238 A | 4/1989 | Tatematsu |
| 4,965,799 A | 10/1990 | Green et al. |
| 5,794,175 A | 8/1998 | Conner |
| 5,959,914 A | 9/1999 | Gates et al. |
| 5,995,424 A | 11/1999 | Lawrence et al. |
| 6,014,759 A | 1/2000 | Manning |

(Continued)

FOREIGN PATENT DOCUMENTS

WO 0229824 4/2002

*Primary Examiner* — Phung M Chung
(74) *Attorney, Agent, or Firm* — Tarolli, Sundheim, Covell & Tummino LLP

(57) ABSTRACT

Systems and methods are provided to determine a solid operating timing window for an integrated circuit device, and the solid operating timing window used to determine a key timing index. A method for determining the solid operating timing window is disclosed. A plurality of sets of operating parameters is generated. For each of the plurality of sets of operating parameters, the respective set of operating parameters is applied to a test environment. The integrated circuit is then operated under the applied respective set of operating parameters. A determining a data valid window is determined for the integrated circuit. The solid operating timing window for the integrated circuit is then determined using the data valid windows for the plurality of sets of operating parameters, where the solid operating timing window is defined as the logical intersection of the determined data valid windows such that the integrated circuit will return valid sample.

36 Claims, 5 Drawing Sheets

(56) References Cited

U.S. PATENT DOCUMENTS

| | | |
|---|---|---|
| 6,055,653 A | 4/2000 | LeBlanc et al. |
| 6,055,661 A | 4/2000 | Luk |
| 6,058,055 A | 5/2000 | Brunelle |
| 6,134,690 A | 10/2000 | Ivaturi et al. |
| 6,178,526 B1 | 1/2001 | Nguyen et al. |
| 6,275,962 B1 | 8/2001 | Fuller et al. |
| 6,345,372 B1 | 2/2002 | Dieckmann et al. |
| 6,389,525 B1 | 5/2002 | Reichert et al. |
| 6,425,095 B1 | 7/2002 | Yasui |
| 6,452,411 B1 | 9/2002 | Miller et al. |
| 6,546,511 B1 | 4/2003 | Sim et al. |
| 6,574,759 B1 | 6/2003 | Woo et al. |
| 6,615,379 B1 | 9/2003 | Tripp et al. |
| 6,646,936 B2 | 11/2003 | Hamamatsu et al. |
| 6,701,474 B2 | 3/2004 | Cooke et al. |
| 6,708,298 B2 * | 3/2004 | Corbin et al. ............ 714/702 |
| 6,731,125 B2 | 5/2004 | Chang |
| 6,754,117 B2 | 6/2004 | Jeddeloh |
| 6,851,076 B1 | 2/2005 | Cook, III et al. |
| 6,880,118 B2 | 4/2005 | Chen et al. |
| 6,888,366 B2 | 5/2005 | Kim et al. |
| 7,010,452 B2 | 3/2006 | Gomes et al. |
| 7,085,980 B2 | 8/2006 | Martin-de-Nicolas et al. |
| 7,088,122 B2 | 8/2006 | Hartmann et al. |
| 7,092,902 B2 | 8/2006 | Eldridge et al. |
| 7,119,567 B2 | 10/2006 | Ma et al. |
| 7,131,046 B2 | 10/2006 | Volkerink et al. |
| 7,142,003 B2 | 11/2006 | Kanbayashi et al. |
| 7,159,160 B2 | 1/2007 | Yoh et al. |
| 7,216,273 B2 * | 5/2007 | Phelps et al. ............ 714/724 |
| 7,620,861 B2 | 11/2009 | Lai et al. |
| 7,757,144 B2 | 7/2010 | Lai et al. |
| 7,848,899 B2 | 12/2010 | Lai et al. |
| 7,852,692 B2 * | 12/2010 | Zhang et al. ............ 365/201 |
| 8,531,899 B2 * | 9/2013 | Zhang et al. ............ 365/200 |
| 2004/0120406 A1 * | 6/2004 | Searles et al. ............ 375/259 |
| 2011/0179324 A1 | 7/2011 | Lai et al. |
| 2012/0047411 A1 | 2/2012 | Lai et al. |

\* cited by examiner

Ideal Data Bit Diagram

Real Data Bit Diagram

SYSTEM AND METHOD FOR TESTING INTEGRATED CIRCUITS BY DETERMINING THE SOLID TIMING WINDOW

CROSS-REFERENCE TO RELATED APPLICATION

This application claims the benefit of U.S. Provisional Patent Application 61/531,309, filed Sep. 6, 2011. The entirety of U.S. Provisional Patent Application No. 61/531,309 is hereby incorporated by reference.

TECHNICAL FIELD

The described embodiments relate generally to systems and methods for testing integrated circuits such as memory modules. More particularly, the described embodiments relate to systems and methods for testing integrated circuits over a range of the integrated circuit's operating parameters.

BACKGROUND

Typically, integrated circuits such as memory modules are tested and certified by memory manufacturers to ensure that memory modules operate properly on signals within parameters that are allowed by the appropriate specifications.

Not only are integrated circuits such as memory modules subject to testing to determine whether they meet manufacturer specifications, but they are also typically subjected to other tests such as pattern testing, parametric tests, and behavioral tests.

Functional tests such as pattern testing and parametric testing verify the functionality of integrated circuits. Pattern testing is an organized method of exercising each memory cell to verify its functionality. Parametric tests verify parameters such as power consumption, standby current, leakage current, voltage levels, and access time.

Behavioral tests, also known as application specific tests, verify that integrated circuits, such as memory modules, operate according to specification in an actual use scenario. An example of a behavioral test would be testing a memory module as it would be used in a personal computing environment running a word processing application.

These tests can be used to determine data valid windows for a memory module, the data valid window defining a period of time in which a valid sample can be expected to be taken from a given data bit region of a given data signal.

SUMMARY

While the above mentioned testing procedures provide an indication of the characteristics of an integrated circuit by their data valid window, they do not provide any indication as to how the integrated circuit will perform over a range of operating conditions such as, for example, temperature, voltage, frequency, and parameters associated with a motherboard. Operating parameters can be used to change the operating conditions under which an integrated circuit is operated. Changes in operating conditions can alter the characteristics of data signals coming from an integrated circuit, which would affect the integrated circuit's data valid window.

A key timing index is disclosed that provides an indication of the quality of an integrated circuit over a range of operating conditions. For example, the key timing index can be used to pair devices with similar key timing indexes (e.g. a memory module and a motherboard) when configuring an application system, thereby indicating how the application system will perform over the range of operating conditions specified by the key timing index. The key timing index is determined using the integrated circuit's solid operating timing window. The solid operating timing window is the logical intersection of data valid windows over a range of operating conditions. That is, it defines a period of time in which a valid sample can be expected to be taken from the given data signal for all sets of operating parameters tested for an integrated circuit.

The present disclosure provides a method and system for determining the solid operating timing window of an integrated circuit. A set of data valid windows for a tested integrated circuit is determined by testing the integrated circuit over a plurality of operating conditions. These operating conditions can include, but are not limited to, temperature, voltage, and frequency. Also, operating conditions can include other parameters associated with, or controllable on, one or more motherboards on which the integrated circuit could be paired with or tested. A solid timing window for the integrated circuit under test can be determined by taking the logical intersection of the plurality of the data valid windows determined during testing. This solid timing window is then used to determine a key timing index which provides an indication of the quality of an integrated circuit over a range of operating conditions.

A skilled person would understand that quality, in the context of a key timing index, means that an integrated circuit having a larger key timing index would indicate that for a range of operating conditions, the integrated circuit would be expected to return valid data over a greater period of time when compared to an integrated circuit with a smaller key timing index, provided that both these integrated circuits possess similar ideal timing windows.

Embodiments disclosed herein relate generally to systems and methods for testing integrated circuit modules by determining the solid operating timing window.

In a first broad aspect, a method for testing an integrated circuit, is provided the method comprising generating a plurality of combinations of operating parameters. Then, for each of the plurality of combinations of operating parameters, setting the respective combination of operating parameters, operating the integrated circuit under the set respective combination of operating parameters and determining a data valid window for the integrated circuit. Once the data valid windows have been determined, then determining a solid operating timing window for the integrated circuit from the determined data valid windows for the plurality of combinations of operating parameters, wherein the solid operating timing window is the logical intersection of the determined data valid windows.

In a second broad aspect, a method of testing an integrated circuit is provided, the method comprising generating a plurality of combinations of operating parameters. For each of the plurality of combinations of operating parameters, the method comprises setting the respective combination of operating parameters, operating the integrated circuit under the set respective combination of operating parameters, generating a plurality of test data, generating a first clock signal having a first frequency and a first phase, and generating a plurality of second clock signals. For each of the plurality of second clock signals having the first frequency and one of a plurality of second phases and for each of the plurality of test data and for each of the plurality of second clock signals, transmitting the respective test data and the first clock signal to the integrated circuit, receiving a data signal from the integrated circuit, capturing the data signal received from the integrated circuit in digital form by sampling the at least one data signal using the respective second clock signal of the plurality of second clock signals, comparing the data signal when captured in digital form with a reference pattern associated with the respective test data; and determining a result from the comparing, wherein the result is associated with both the respective test data and the respective second clock signal having one of the plurality of second phases. The method identifying a data valid window for the integrated circuit from the said results determined for the plurality of test data and the plurality of second clock signals, determining a solid operating timing window for the integrated circuit from the identified data valid windows for the plurality of combinations of operating parameters, wherein the solid operating timing window is the logical intersection of the identified data valid windows.

In a third broad aspect, a system for testing an integrated circuit is provided, the system comprising a microprocessor, a program memory, a controller, and a test environment for operating the integrated circuit. The system is configured to generate a plurality of combinations of operating parameters. For each of the combinations of operating parameters the test system is configured to set the respective combination of operating parameters for the test environment, operate the integrated circuit in the test environment under the set respective combination of operating parameters, and determine a data valid window for the integrated circuit. The system is configured to determine a solid operating timing window for the integrated circuit from the determined data valid windows for the plurality of combinations of operating parameters, wherein the solid operating timing window is the logical intersection of the determined data valid windows.

In a fourth broad aspect, a system for testing an integrated circuit is provided, the system comprising a microprocessor, a program memory, a controller, and a test environment for operating the integrated circuit. The system is configured to generate a plurality of combinations of operating parameters, and for each of the plurality of combinations of operating parameters set the respective combination of operating parameters on the test environment. The system is configured to operate the integrated circuit in the test environment under the set respective combination of operating parameters, generate a plurality of test data, generate a first clock signal having a first frequency and a first phase, and generate a plurality of second clock signals, each of the plurality of second clock signals having the first frequency and one of a plurality of second phases. For each of the plurality of test data and for each of the plurality of second clock signals, the system is configured to transmit the respective test data and the first clock signal to the integrated circuit, receive a data signal from the integrated circuit, capture the data signal received from the integrated circuit in digital form by sampling the at least one data signal using the respective second clock signal of the plurality of second clock signals, compare the data signal when captured in digital form with a reference pattern associated with the respective test data; and determine a result from the comparing, wherein the result is associated with both the respective test data and the respective second clock signal having one of the plurality of second phases. The system is configured to identify a data valid window for the integrated circuit from the said results determined for the plurality of test data and the plurality of second clock signals, determine a solid operating timing window for the integrated circuit from the identified data valid windows for the plurality of combinations of operating parameters, wherein the solid operating timing window is the logical intersection of the identified data valid windows.

In an example embodiment, the systems and methods further comprise determining a key timing index for the integrated circuit from the determined solid operating timing window, wherein the key timing index is determined by dividing the solid timing window by an ideal timing window and then multiplying by 100.

In a further example embodiment, the systems and methods further comprise outputting a test outcome for the integrated circuit based on the key timing index.

In another example embodiment, determining a data valid window comprises generating a plurality of test data, the plurality of test data generated by tapping application data transmitted to a reference integrated circuit provided within an application system in which an application task is performed, and a test vector pattern generator.

In another example embodiment, determining a data valid window comprises generating a plurality of test data, the plurality of test data generated by tapping application data transmitted to a reference integrated circuit provided within an application system in which an application task is performed, wherein the application system comprises a motherboard.

In another example embodiment, determining a data valid window comprises generating a plurality of test data, the plurality of test data generated by a test vector pattern generator.

In another example embodiment, the integrated circuit is a memory module.

In another example embodiment, the integrated circuit is an application specific integrated circuit (ASIC).

In another example embodiment, the operating parameters are one of at least temperature, voltage, frequency, and parameters associated with a motherboard.

Features of these and other aspects and example embodiments are described herein.

DETAILED DESCRIPTION

In order to determine the key timing index for an integrated circuit, e.g. memory module or ASIC, the solid timing window for the integrated circuit must be determined. Determining a solid operating timing window for an integrated circuit requires that a plurality of data valid windows for the integrated circuit is determined over a range of operating conditions. Determining the data valid window of an integrated circuit are known, and discussions of example methods and systems can be found in US Published Patent Application 2012/0047411 (Lai) and U.S. Pat. No. 7,757,144 (Lai), of which the entirety of both are incorporated by reference.

The data valid window defines a period of time in which a valid sample can be expected to be taken from within a given data bit region of a given data signal, such as the response data signal received by a tester from the integrated circuit. Each part of a given data signal in which the value of a single bit (i.e. "1" or "0") is asserted so that the bit may be read from the given data signal constitutes a data bit region.

Figure 1A:
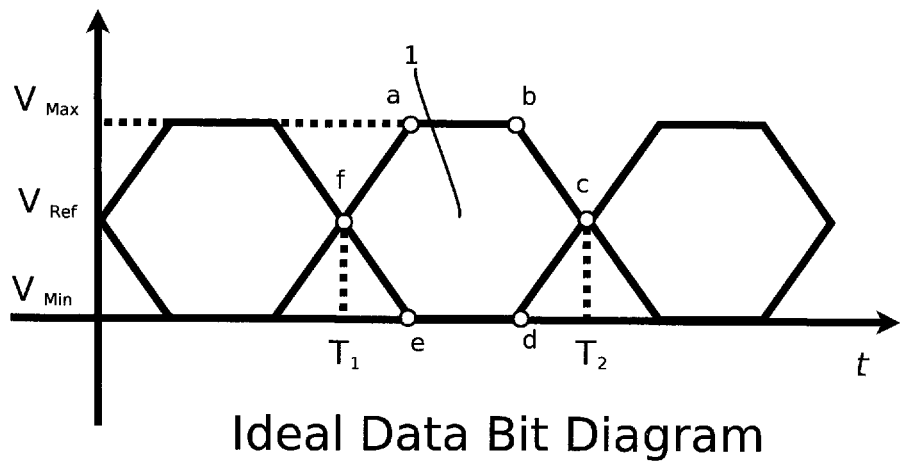
FIGS. 1A and 1B illustrate examples of data bit diagrams, wherein a data bit region and a corresponding data valid window is identified.
Figure 1B:
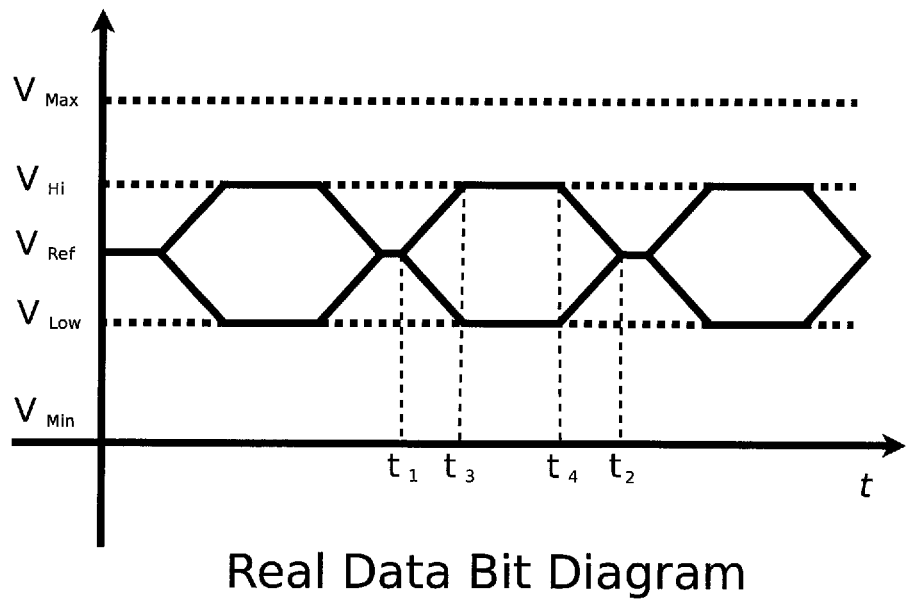

For instance, consider the example data bit diagrams shown in FIGS. 1A and 1B. In the "Ideal Data Bit Diagram" of FIG. 1A, a series of data bit regions is illustrated. Each of these data bit regions, for example the data bit region 1 bound by a-f in FIG. 1A, represents a theoretical region where a sample taken from any point within the data bit region would return valid data. That is, between the time $T_1$ and $T_2$, sampling the data bit region would return a valid logical 1 (defined as the area between voltage $V_{Ref}$ and $V_{Max}$) or a valid logical 0 (defined as the area between $V_{Ref}$ and $V_{Min}$).

The "Real Data Bit Diagram" shown in FIG. 1B illustrates that, in practice, there is a shorter period of time within the ideal size of a data bit region in the time dimension (i.e. of the data bit duration) in which a valid sample can be expected to be taken. This may imply that the effective length of the data bit region in the time dimension will shrink (e.g. see interval $[t_1, t_2]$). Furthermore, in practice, the range between the voltage level corresponding to a logical "1" and the voltage level corresponding to a logical "0" of the actual received data signal may also be narrower, as compared to the ideal size of the data bit region in the voltage dimension (i.e. the data bit amplitude). These properties of the data signal as it is actually received (e.g. by a tester) may be taken into account when determining a data valid window.

The data valid window for an integrated circuit, or device under test (DUT), identifies components (e.g. the time and/or the voltage dimension) of a response data signal where the data signal can always be expected to be stable and not to be undergoing a transition from "1" to "0" or vice-versa. Any sample taken outside of the data valid window would not be guaranteed to contain valid data.

In the example of FIG. 1B, the period of time in which the response data signal can be expected to be stable is shown by the interval $[t_3, t_4]$, and the range of voltage values in which the response data signal can be expected to be stable is shown by the interval $[V_{Low}, V_{Hi}]$. The length of these intervals, and the specific values defining the boundaries of these intervals are examples of characteristics of a data valid window for a DUT. Each DUT may have a different data valid window associated therewith. In some circumstances the DUT may not have a data valid window. This can be because the DUT is, for example, defective or unable to meet the required specifications.

It will be understood that changes in the operating parameters of a DUT may change the characteristics of data signals coming from the DUT. That is, variations in operating conditions (for example, without limitation, temperature, voltage, frequency, or parameters associated with one or more motherboards on which the integrated circuit could be paired or tested) may affect the data valid window. Accordingly, the data valid windows determined for a DUT may not be aligned with one another when operating parameters such as temperature, voltage, or frequency are varied. However, the determined data valid windows for the range of tested operating parameters may overlap. This overlapping portion defines a window that would return valid data for the range of operating parameters tested. This overlapping data valid window is considered the "solid operating timing window".

Thus, the solid operating timing window is defined as a period of time in which a valid sample can be expected to be taken from the given data signal for a set of operating parameters tested for a device. Logically, then, a sample taken outside of a solid operating timing window may contain valid data for some operating parameters but contain invalid data for other operating parameters. Thus a solid operating timing window is a logical intersection of all identified data valid windows determined over a plurality of operating parameters. That is, the solid operating timing window identifies a window whereby the DUT will provide valid data for a range of operating parameters. This range of operating parameters can be described in the device's specification, though it would be obvious to a skilled person in the art that other operating parameters may be used to test the device.

Figure 2A:
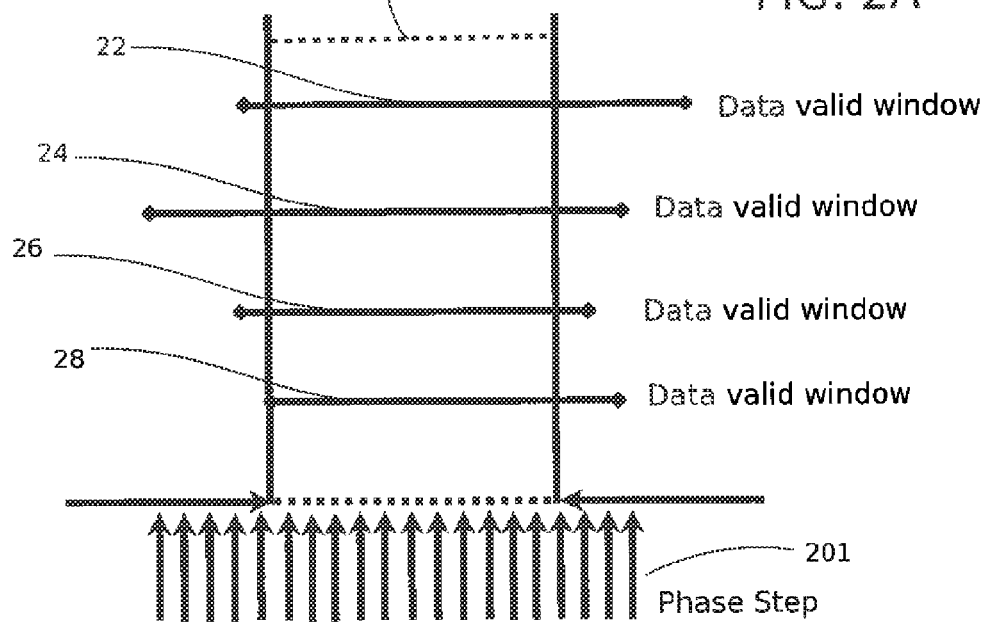
FIG. 2A is a schematic diagram of an embodiment that illustrates how a solid operating timing window may be determined based on a plurality of identified data valid windows for each set of operating parameters of the integrated circuit.

To illustrate by way of example, FIG. 2A is a schematic diagram that illustrates how a solid operating timing window may be identified based on data valid windows determined for different sets of possible operating parameters of a DUT. In this example, a testing apparatus has determined a set of data valid windows (22, 24, 26 and 28 respectively) for each of the four combinations of operating parameters tested on the DUT. These operating parameters, for example, can include temperature, voltage, frequency and other parameters, either individually or in any combination. As samples are taken at a particular phase step, as shown by 201, the data valid windows return valid data for the respective set of operating parameters tested.

In this example, the period of time in which data valid windows 22, 24, 26, and 28 overlap is the solid operating timing window. That is, the solid operating timing window 20 can be determined as a logical intersection of all of the identified data valid windows 22, 24, 26 and 28.

Figure 2B:
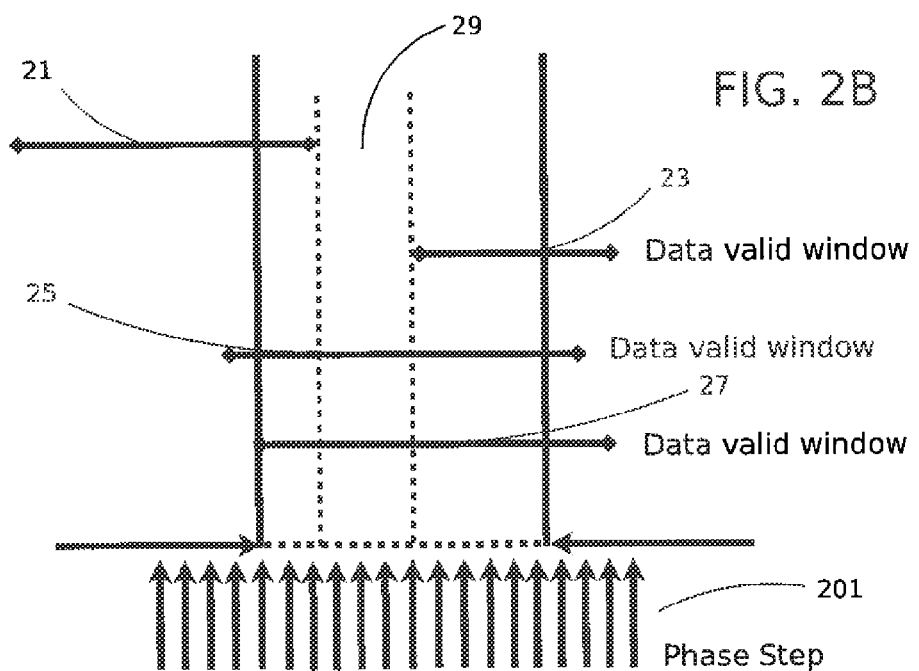
FIG. 2B is a schematic diagram of an embodiment that illustrates how a solid operating timing window is not defined if there is no logical intersection of the plurality of identified data valid windows.

It will also be understood that if no logical intersection of the data valid windows exists then no solid operating timing window may be determined. As is shown in FIG. 2B, the data valid windows 21, 23, 25, and 27 do not logically intersect as shown by the area bounded 29. Thus, in this example, a solid timing window cannot be defined for all the operating parameters tested.

Figure 3:
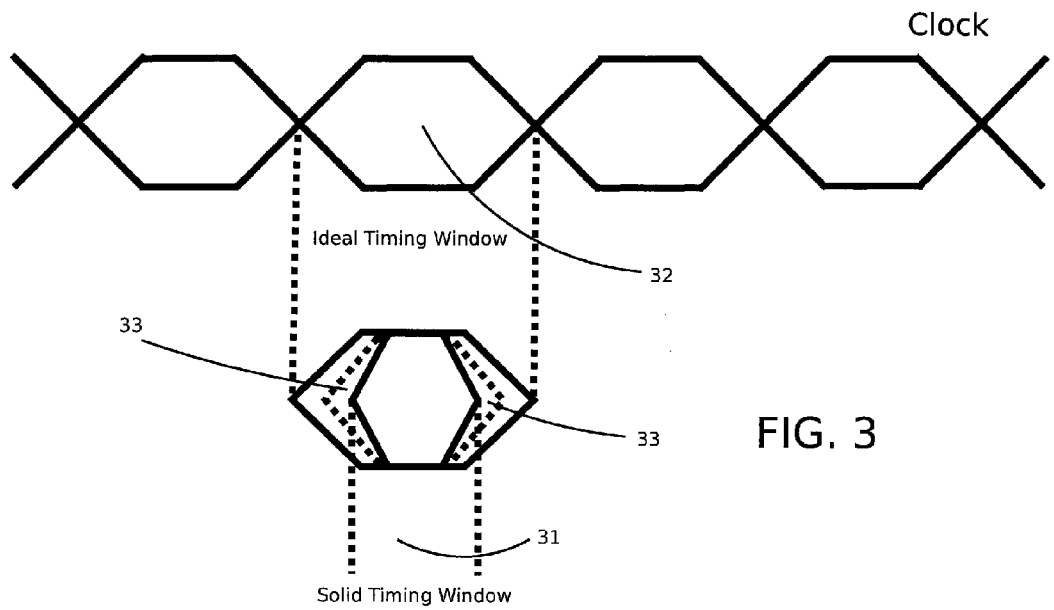
FIG. 3 illustrates a solid timing window in the context of an ideal timing window, in accordance with at least one embodiment.

A key timing index can be determined using the determined solid timing window, if the solid operating timing window is determined, and the ideal timing window, as shown in FIG. 3. This key timing index can be used to estimate the quality of the DUT under a range of operating conditions as indicated by the operating parameters. A skilled person would understand that quality, in the context of a key timing index, means that an integrated circuit having a larger key timing index would indicate that for a range of operating conditions, the integrated circuit would be expected to return valid data over a greater period of time when compared to an integrated circuit with a smaller key timing index, provided that both these integrated circuits possess similar ideal timing windows.

The key timing index can be determined by dividing the solid operating timing window (as shown by 31 of FIG. 3) by the ideal timing window (as shown by 32 of FIG. 3) of the DUT and multiplying by 100. This example shows an ideal clock window for double data rate signal devices (for example, DDR, DDR2, DDR3 RAM). Thus, in this example the ideal timing window is determined to be a half-clock period corresponding to data transitions at the rising and falling edges of the corresponding clock. However, other integrated circuits may operate at different clock rates, and the ideal timing window would be proportional to the clock. For example, an ideal timing window for a single rate signal device would be the entire clock period. For further clarity, the formula for calculating the key timing index is shown below:

key timing index=(solid operating timing window/ ideal timing window)×100

It should be noted that areas outside of the solid operating timing window, as can be seen in the areas shown by 33, represent marginal areas. In contrast to the solid operating timing window, these marginal areas may or may not return a valid data signal for the respective set of operating parameters tested.

Figure 4:
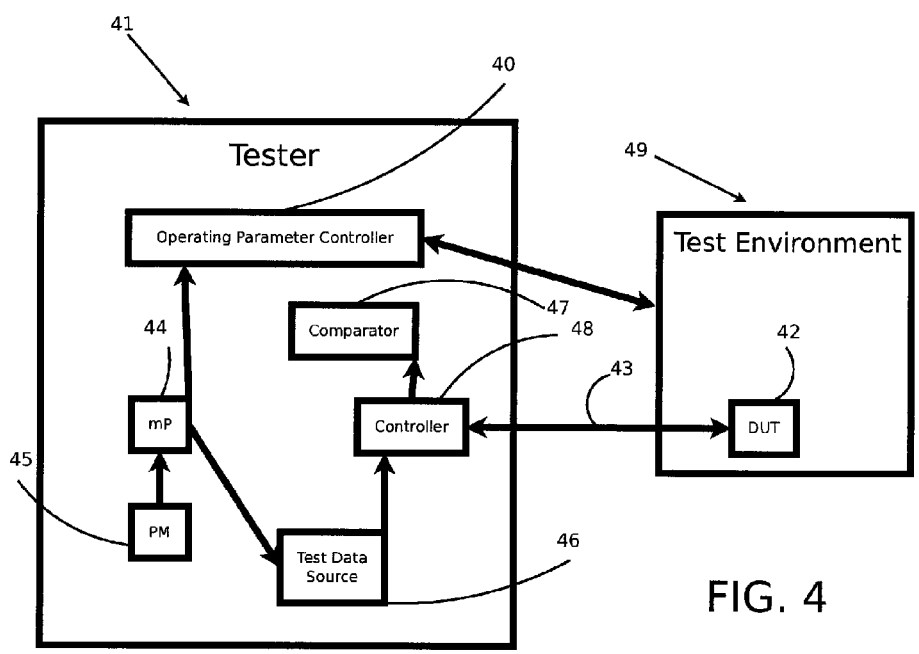
FIG. 4 is a block diagram of an embodiment of a system for determining a solid timing window in accordance with at least one embodiment.

Reference is now made to FIG. 4, in which an example system for determining the solid timing window of a DUT is shown. The system for determining a solid timing window comprises an operating parameter controller 40 configured to set operating parameters such as temperature, voltage, frequency, or parameters associated with a motherboard on a testing environment 49. In this example embodiment the operating parameter controller 40 is internal to the tester 41, although alternative embodiments where the operating parameter controller is external to the tester would be obvious to a skilled person. Furthermore, in alternate embodiments the operating parameter controller 40 may be integrated with other controllers, such as controller 48 for example.

The system for testing a DUT 42 further comprises a tester 41 comprising a microprocessor (mP) 44, program memory (PM) 45, a test data source 46, a controller 48, and at least one comparator 47 for the integrated circuit under test 42. In the example shown in FIG. 6, tester 41 has a comparator block 47. It would be obvious to a skilled technician that multiple integrated circuits 42 could be tested simultaneously, and that each DUT 42 would require at least its own comparator 47, controller 48, and communication channel 43. A skilled person would understand that in another embodiment the communication channel may be shared among multiple DUTs.

In some embodiments the tester 41 may also comprise a reference device (not shown). The reference device would be an integrated circuit that is known to return valid data for the various test scenarios. This allows for return signals from the DUT 42 to be compared against the return signals of a known reference device.

The tester 41 is coupled to the DUT 42 across a communication channel 43. DUT 42 can be an integrated circuit or a plurality of integrated circuits, examples of which include memory modules and ASICs. There are various embodiments of the testing environment, for example, the DUT 42 may operate as part of personal computer system that has a motherboard, or one or more motherboards. However, in another embodiment, for testing purposes DUT 42 may be tested independently of other components of the computer system. For example, the DUT 42 may be placed on a testing board in a chip handler that comprises the test environment 49. An advantage of a testing environment that comprises a motherboard or multiple motherboards is that it more accurately represents the environment in which a DUT would be used when compared to a test environment where the DUT is tested independently of other components of the motherboard or motherboards. It is understood that a motherboard is representative of a computer system.

In performing the testing of a DUT 42, microprocessor 44 retrieves an instruction or instructions from program memory 45. In response to that instruction, the microprocessor 44 instructs the operating parameter controller 40 to set the test operating parameters on the test environment 49. The integrated circuit is then tested under the operating parameters set on the test environment. The microprocessor 44 then instructs test data source 46 to send test data to controller 48. Controller 48 communicates with DUT 42 via a communication channel 43. After receiving the test data from the test data source 46, controller 48 converts the test data into an electrical waveform, which controller 48 then outputs to DUT 42 via communication channel 43. In some embodiments, the same test data sent to the DUT 42 can also sent to a reference device for use at a later stage in the testing.

The test data may be generated at the tester 41 using a test vector pattern generator (not shown). If the DUT 42 is operating in an application system, test data may also be obtained by "tapping" the inputs and outputs of a reference device to obtain test data representative of typical system operations, such as system operations used when executing a word processing application. Examples of these "tapping" interfaces are discussed in U.S. Pat. No. 7,848,899 (Lai) and US Published Patent Application 2011/0179324 (Lai), of which the entirety of both are hereby incorporated by reference. It would be obvious to a skilled person that other means of generating test data could be contemplated that would be within the scope of this disclosure.

This test data is used by the tester (41) to determine the data valid window for the DUT 42. A skilled technician would understand that any combination of test data, whether generated solely by a test vector pattern generator, solely by "tapping" as discussed above, or both, could be used to determine the data valid window for the DUT 42. It is noted, however, that test data comprising both "tapped" test data and test data generated by a test vector pattern generator generally provides more comprehensive test data for testing, which can allow for a more accurately defined data valid window.

The DUT 42 then transmits a response signal back to the tester 41. The controller 48 of tester 41 converts the response received via communication channel 43 into digital form. Controller 48 will expect to receive and then sample a particular waveform as a response from the DUT 42.

Tester 41 and DUT 42 both operate on digital representations of test data. However, as noted above, what is transmitted across communication channel 43 is an electrical waveform that is representative of the test data waveform. Conversion between the electrical and digital forms of a test data generally occurs at the input and/or output ports of both tester 41 and DUT 42. These conversions require sampling the received signal. In the case of tester 41, in this example embodiment the controller 48 performs the conversion. In the case of DUT 42, an appropriate component, such as an input buffer (not shown) or controller (not shown), may be configured to perform the conversion, as known to a person skilled in the art.

After controller 48 receives a response signal from the DUT 42, it relays the sampled response signal to the comparator 47. The response signal from the DUT 42 is compared, at the comparator 47, with a reference digital signal—that is, the signal that controller 48 expects to receive from the particular DUT 42. In one embodiment, the reference signal is sent from the test data source 46 to the comparator 47. In another embodiment, the reference signal is a signal transmitted to the comparator 47 from reference device (not shown). The comparator 47 digitally determines whether the response signal matches the reference signal, and outputs the logical determination to microprocessor 44.

If the comparator 47 determines a match between the two compared signals (that is between the response signal and the reference signal), then the DUT 42 has, at least in the context of that particular test data, produced valid data. But where the two compared signals are not identical, then the DUT 42 may have undergone a failure of some kind. Where the DUT 42 has been determined to perform according to specification requirements, then DUT 42 may be considered to be "good".

Figure 5:
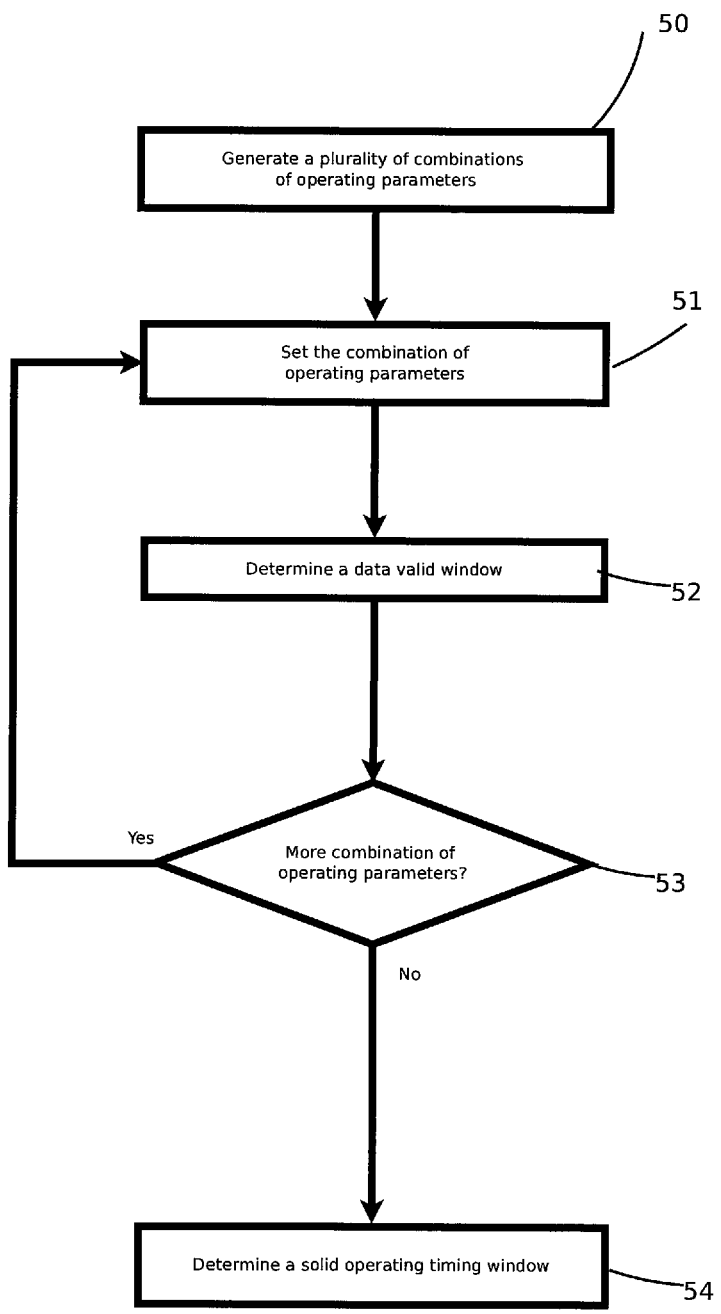
FIG. 5 is a flowchart of an embodiment of a method for testing an integrated circuit in accordance with at least one embodiment.
Figure 6:
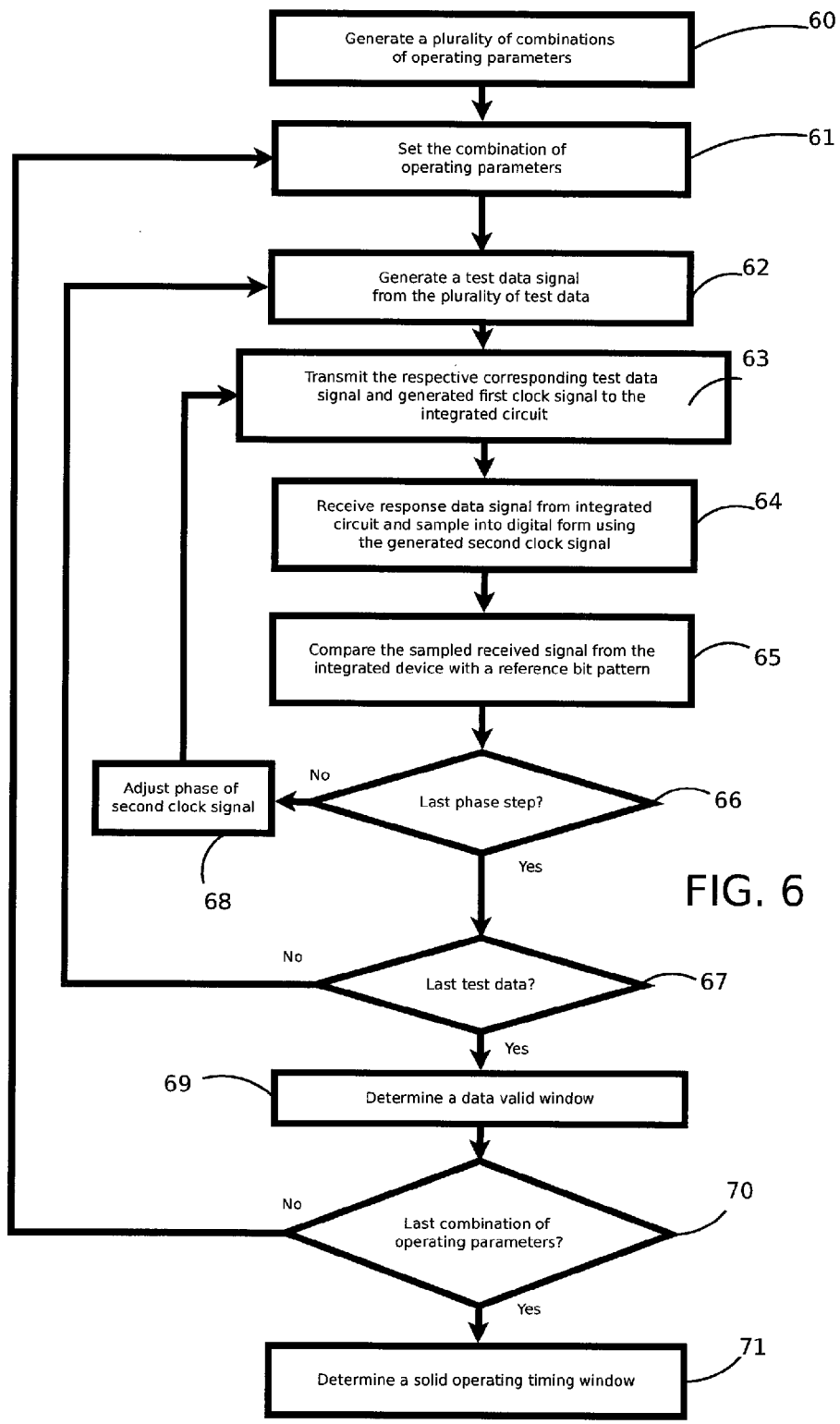
FIG. 6 is a flowchart of an embodiment of a method for testing an integrated circuit in accordance with at least one embodiment.

Reference is now made to FIGS. 5 and 6, which are flowcharts outlining embodiments of methods for testing an integrated circuit to determine its solid timing window in accordance with at least one embodiment. As is shown in 50 and 60, a plurality of combinations of operating parameters is first generated. These operating parameters can include, without limitation, at least one of temperature, voltage, or frequency. In an embodiment, the test equipment may be configured to accept the generated plurality of combinations of operating parameters, though it would be obvious to one skilled in the art that, in another embodiment, the test equipment could also generate the plurality of combinations of operating parameters internally.

Each of the plurality of combinations of operating parameters is used to set the specified operating parameters on the test environment in FIG. 4 element 49, as shown in 51 and 61. That is, for each of the plurality of operating parameters, the specific combination of operating parameters is used to set the test environment 49 prior to the step of determining the data valid window (52 and 62-69). The plurality of combinations of operating parameters typically involves varying individually or in combination the voltage, frequency, temperature, or parameters associated with a motherboard that the integrated circuit under test will be operated under. Additionally, any other operating parameter controllable by the tester 41 or test environment's 49 hardware or software or both may be included in the combination of operating parameters. The individual operating parameters may be changed in a step wise fashion over a range of values. For example, the voltage could be adjusted from a low to high, or high to low. Furthermore, more than one of the operating parameters may be varied. This would comprise a set of combinations of operating parameters, e.g. (Voltage_1, Frequency_1, Temperature_1), (Voltage_2, Frequency_2, Temperature_2), and (Voltage_3, Frequency_3, Temperature_3), where at least one or more of the operating parameters would change between combinations of operating parameters.

In an example embodiment, the test environment 49 is an integrated circuit handler. The handler can be equipped with a unit for adjusting the operating conditions of the test environment. For example, the handler can be instructed to set the temperature of the test environment. In another possible embodiment, the test environment 49 can be internal to the tester 41.

When the specific combination of operating parameters is set on the test environment 49, the integrated circuit is operated under the set respective combination of operating parameters and a data valid window, if it exists, for the integrated circuit can be determined, as shown in 52. It will be understood that, in some circumstances, a data valid window can not be determined for a particular DUT. This may be because the integrated circuit under test is, for example, defective.

In another example embodiment (as shown in 63-69) determining the data valid window further comprises generating test data as shown in 62. As was discussed above, test data can be generated in a variety of ways including, but not limited to, by being "tapped" from an application system, by being generated by a test vector pattern generator, or both.

For each of the plurality of test data, the corresponding test data signal and first clock signal is sent to the DUT as shown in 63. As was discussed above, electrical signals sent to and from the tester 41 and integrated circuit (or DUT 42) are sampled to convert them to a digital form and vice versa. In order to facilitate sampling of an electrical waveform into the digital test data at the DUT 42, the tester 41 generates a first clock signal having a first frequency and a first phase. For instance, consider an example where test signals are to be transmitted from a tester 41 to the DUT 42. During the test, a data signal comprising a test data waveform corresponding to the test data is transmitted to the DUT 42 along with an accompanying first clock signal generated by the tester that is synchronized with the test data waveform. The first clock signal is synchronized with the test data waveform in accordance with the specification of the DUT 42 so that the DUT 42 can use the first clock signal to properly read from the test data waveform. For example, if the DUT 42 is a memory module that receives a "write" command from the tester, the memory module will expect that the data intended to be written to memory will follow in the test data waveform in a certain number of cycles of the first clock signal after the "write" command is received.

Subsequently, after data is transmitted to the DUT 42 as shown in 63, the tester 41 can then read from the respective DUT 42. That is, the tester receives a response data signal sent from the DUT 42 as shown in 64. In order to sample the electrical waveform being received from the DUT 42 into a digital test data, the tester 41 may generate a plurality of second clock signals having a first frequency and a second phase (not shown).

When sampling the electrical signal to digital form, the second clock signal may have the same frequency as the first clock signal to which the transmitted test data was synchronized. However, unlike the first clock signal, which is generally be fixed in phase for a particular test cycle, the second clock signal will generally have an adjustable phase for the same test cycle. In a given test cycle, the phase of the second clock signal may be (e.g. incrementally) adjusted by multiple phase steps (e.g. if the clock frequency is 500 MHz or the period of the second clock signal is 2 ns, then each phase step might be 10 ps). This allows a series of "data valid windows" to be determined for each of the DUT 42 within the test cycle, as will be discussed below.

Once the received electrical signal has been sampled into digital form it can be compared with a reference data associated with the respective test data, as shown in 65. In an example embodiment, the reference data can be data that is received in response to sending the respective test data and first clock signal to a reference device, where the reference integrated circuit is known to respond according to the specifications of the integrated circuit. In another example embodiment, this reference data may be data generated by a test vector pattern generator (not shown). In another example embodiment where the integrated circuit is a memory module, the reference data may be same as the test data. This is because the expectation is that a memory module, when read, will return the same data as was written earlier to the memory module.

The result of the comparison of step 65 is associated with the respective test data and the respective second clock signal having one of the plurality of second phases.

As shown in 66, in order to identify a series of data valid windows for the DUT 42 a signal corresponding to test data and its corresponding first clock signal (e.g. with a fixed particular phase) are retransmitted to the DUT 42 while the phase of the second sampling clock is adjusted incrementally, for example, by a phase step (as shown in 68). The retransmission of test data signals to the DUT 42 (as shown in 63), the phase changing of the second sampling clock 68, the sampling of data signals received from the DUT 42 as shown in 64, and the comparison of the samples obtained as shown in 65 may be repeated for each phase step of a predefined number of phase steps that comprise a test cycle. The results of the comparisons made in 65 may be stored.

It will be understood that as the second sampling clock is changed in phase, the samples obtained from a particular data signal will be valid at certain phases (i.e. a stable value is obtained from the data signal and it matches the expected value of a reference signal), while the samples obtained from the data signal at other phases will not be valid (i.e. the signal value obtained at the given phase step does not always match the expected value of a reference signal). If the DUT 42 being tested is "good", it will be expected that a valid sample of the particular data signal received from a the DUT 42 may be taken over a finite number of consecutive phase steps of the second sampling clock, provided that the phase steps are sufficiently small. Using this information, a test engineer or test program, for example, will be able to identify data valid window for that DUT 42. The results from all of the comparisons 65 performed during the test can then be used to identify a data valid window for the DUT 42 as shown in 69.

As is shown in FIG. 5 element 53 and FIG. 6 element 70, the tests are repeated for each of the plurality of combinations of operating parameters until no combination of operating parameters remains. Each iteration of the test determines a respective data valid window, if one can be determined, for each of the combinations of operating parameters. The result of these repeated tests is a set of data valid windows. While repeating the test for each of the combination of operating parameters, data valid window results determined by the test can be stored, for example, in a data store (such as RAM, a relational database, a hard drive, or a solid state drive) located internally or externally to the testing apparatus. It would be obvious to one skilled in the art that alternative solutions for storing data valid window results could be used that would that fall within the scope of this disclosure.

As is shown in FIG. 4 element 54 and FIG. 5 element 71, the set of data valid windows is then used to determine the solid timing window for the DUT. This solid timing window is the logical intersection of the set of data valid windows determined for the plurality of combinations of operating parameters. A skilled person would understand that determining the logical intersection of a set of data is well known. For example, the test apparatus may employ software or a logic circuit external to the tester to determine the logical intersection of the data valid windows. Another example embodiment of the method for determining a solid timing window would be to take the max, or ceiling, of the low boundaries of the data valid windows and the min, or floor, of the high boundaries of the data valid windows, where the solid timing window would be defined if the max, or ceiling, of the low boundary of data valid windows is less than the min, or floor, of the high boundary of the data valid windows. It would be understood by a person skilled in the art that alternative solutions for determining the logical intersection of data valid windows may be used.

In another example embodiment, systems and methods (not shown) are provided for outputting a test outcome for the integrated circuit based on the key timing index, solid timing window, or both. For example, one of the comparator, controller, or microprocessor may be configured to transmit a message or signal representing the output of results of the the test. This output can be used to sort, categorize, or otherwise identify integrated circuits that have a determined solid timing window or key timing index. For instance, this output may be used by a test program or test engineer to identify a solid timing window, key timing index, or both for a DUT. As another example, the output may be used by a handler to sort the DUT using the output test results.

In another example embodiment, systems and methods are provided for determining a key timing index for a DUT where the key timing index is determined by dividing the solid timing window by an ideal timing window and then multiplying by 100. For example, the testing apparatus may be configured to calculate the key timing index after the solid timing window of the integrated circuit has been determined. It would be understood by a person skilled in the art that alternative solutions for determining the key timing index are possible.

In another example embodiment, systems and methods are provided that can use test data generated by tapping application data transmitted to a reference integrated circuit provided within an application system in which an application task is performed, or by a test vector pattern generator, or both. The application system may comprise a motherboard. A skilled technician would understand that subjecting the integrated circuit to both behavioral and functional testing would provide the most comprehensive results, though for various reasons (e.g. cost, efficiency or speed), it may be appropriate to test the integrated circuit using either behavioral methods or functional methods.

Behavioral testing, which can include tapping an application system as described above, generally provides more accurate results than functional testing alone when used to determine a solid operating timing window. The process of running applications instead of functional tests in order to generate test data, however, is more time consuming and can impact the efficiency of testing integrated circuits. Thus, the test data source used can change depending on commercial or industrial applications. For example functional testing, which uses patterns generated by a test vector pattern generator, is faster than behavioral testing and may be used in high speed production and testing environments.

In another example embodiment, systems and methods are provided for testing an integrated circuit that is a memory module.

In another example embodiment, systems and methods are provided for testing an integrated circuit that is an ASIC.

In another example embodiment, systems and methods are provided that can verify that the key timing index of the integrated circuit meets specification requirements. For example, this can be accomplished by comparing the identified key timing index with a key timing index provided in the integrated circuit's data sheet.

In another example embodiment, systems and methods are provided wherein the operating parameters are one of at least temperature, voltage, frequency, and parameters associated with a motherboard. Example parameters associated with a motherboard can additionally include, but are not limited to, clock skew, and jitter.

In another example embodiment, a test environment for the integrated circuit can be proxied to another module. For example, an integrated circuit handler can be used as the test environment. A handler would be used in concert with the system to handle, test, and sort a plurality of integrated circuits to be tested. For example, a handler is programmed to position an integrated circuit for testing. The handler can also be configured to adjust operating parameters, such as temperature, in response to commands from the operating parameter controller. Furthermore, after the key timing index has been determined for an integrated circuit, the handler may be configured to mark, sort, or otherwise classify the integrated circuit according to the key timing index determined by the tester. It would be obvious to a skilled technician that known alternatives to automated handlers could also be used for testing in a production environment that would be within the scope of this disclosure.

In another example embodiment, a test environment for the integrated circuit may be a test board located within the system, the test board configured to adjust operating parameters such as temperature in response to commands from the operating parameter controller.

In the example embodiments described above, acts of the method performed by the tester may, in other variant embodiments, be proxied to a different module or modules coupled to the tester.

The embodiments described herein have been shown and described by way of a number of examples. It will be apparent to those skilled in the art that changes and modifications to the described embodiments may be made without departing from the substance and the scope of the described embodiments, as defined in the appended claims.

The invention claimed is:

1. A method for testing an integrated circuit, the method comprising:
generating a plurality of sets of operating parameters;
for each of the plurality of sets of operating parameters:
applying a respective set of operating parameters to a test environment;
operating the integrated circuit in the test environment; and
determining a data valid window for the integrated circuit for the respective set of operating parameters; and
when the data valid windows have been determined for the plurality of sets of operating parameters, the data valid windows defining a set of determined data valid windows;
determining a solid operating timing window for the integrated circuit from the set of determined data valid windows whereby the solid operating timing window is defined as a logical intersection of the data valid windows belonging to the set of determined data valid windows such that the integrated circuit will return a valid sample; and no solid operating timing window is defined where there is no logical intersection of the data valid windows belonging to the set of determined data valid windows.

2. The method of claim 1, further comprising:
determining a key timing index for the integrated circuit from the solid operating timing window, wherein the key timing index is determined by dividing the solid timing window by an ideal timing window and then multiplying by 100.

3. The method of claim 2, further comprising:
outputting a test outcome for the integrated circuit based on the key timing index.

4. The method of claim 3, wherein determining the data valid window comprises:
generating a plurality of test data, the plurality of test data generated by both:
a test vector pattern generate; and
tapping application data transmitted to a reference integrated circuit provided within an application system in which an application task is performed.

5. The method of claim 3, wherein determining the data valid window comprises:
generating a plurality of test data, the plurality of test data generated by tapping application data transmitted to a reference integrated circuit provided within an application system in which an application task is performed, wherein the application system comprises a motherboard.

6. The method of claim 3, wherein determining the data valid window comprises:
generating a plurality of test data, the plurality of test data generated by a test vector pattern generator.

7. The method of claim 3, wherein the integrated circuit is a memory module.

8. The method of claim 3, wherein the integrated circuit is an ASIC.

9. The method of claim 3, wherein an operating parameter in the set of operating parameters includes at least one of temperature, voltage, frequency, and parameters associated with a motherboard.

10. A method of testing an integrated circuit, the method comprising:
generating a plurality of sets of operating parameters;
for each of the plurality of sets of operating parameters:
applying a respective set of operating parameters to a test environment;
operating the integrated circuit in the test environment;
generating a plurality of test data;
generating a first clock signal having a first frequency and a first phase;
generating a plurality of second clock signals, each of the plurality of second clock signals having the first frequency and one of a plurality of second phases;
for each of the plurality of test data and for each of the plurality of second clock signals:
transmitting the respective test data and the first clock signal to the integrated circuit;
receiving a data signal from the integrated circuit;
capturing the data signal received from the integrated circuit in digital form by sampling the at least one data signal using the respective second clock signal of the plurality of second clock signals;
comparing the data signal when captured in digital form with a reference pattern associated with the respective test data;
determining a result from the comparing, wherein the result is associated with both the respective test data and the respective second clock signal having one of the plurality of second phases; and
identifying a data valid window for the integrated circuit for the applied set of operating parameters from the said results determined for the plurality of test data and the plurality of second clock signals; and
when the data valid windows have been identified for the plurality of sets of operating parameters, the data valid windows defining a set of identified data valid windows:
determining a solid operating timing window for the integrated circuit from the set of identified data valid windows, whereby the solid operating timing window is defined as a logical intersection of the data valid windows belonging to the set of identified data valid windows such that the integrated circuit will return a valid sample and no solid operating timing window is defined where there is no logical intersection of the data valid windows belonging to the set of identified data valid windows.

11. The method of claim 10, further comprising: determining a key timing index for the integrated circuit from the solid operating timing window, wherein the key timing index is determined by dividing the solid timing window by an ideal timing window and then multiplying by 100.

12. The method of claim 11, further comprising:
outputting a test outcome for the integrated circuit based on the key timing index.

13. The method of claim 12, wherein the plurality of test data is generated by both:
a test vector pattern generator; and
tapping application data transmitted to a reference integrated circuit provided within an application system in which an application task is performed.

14. The method of claim 12, wherein the plurality of test data is generated by tapping application data transmitted to a reference integrated circuit provided within an application system in which an application task is performed, wherein the application system comprises a motherboard.

15. The method of claim 12, wherein the plurality of test data is generated by a test vector pattern generator.

16. The method of claim 12, wherein the integrated circuit is a memory module.

17. The method of claim 12, wherein the integrated circuit is an ASIC.

18. The method of claim 12, wherein an operating parameters in the set of operating parameters includes at least one of temperature, voltage, frequency, and parameters associated with a motherboard.

19. A system for testing an integrated circuit, the system comprising:
a test environment for operating the integrated circuit, the test environment having:
a program memory for storing instructions;
a microprocessor for retrieving instructions from the program memory, the microprocessor configured to:
instruct an operating parameter controller to apply the set of operating parameters to the test environment and send a test data to a controller; and
a controller for converting the test data between a digital form and an electrical waveform;
wherein the system is configured to:
generate a plurality of sets of operating parameters;
for each of the sets of operating parameters:
apply the respective set of operating parameters to the test environment;
operate the integrated circuit, using the test data, in the test environment; and
determine a data valid window for the integrated circuit for the set of operating parameters; and
when the data valid windows have been determined for the plurality of sets of operating parameters, the data valid windows defining a set of determined data valid windows:
determine a solid operating timing window for the integrated circuit from the set of determined data valid windows, whereby the solid operating timing window is defined as a logical intersection of the data valid windows belonging to the set of determined data valid windows such that the integrated circuit will return a valid sample, and no solid operating timing window is defined where there is no logical intersection of the data valid windows belonging to the set of determined data valid windows.

20. The system of claim 19, wherein the system is further configured to:
determine a key timing index for the integrated circuit from the solid operating timing window, wherein the key timing index is determined by dividing the solid timing window by an ideal timing window and then multiplying by 100.

21. The system of claim 20, wherein the system is further configured to:
output a test outcome for the integrated circuit based on the key timing index.

22. The system of claim 21, wherein the system further comprises:
a test data source;
wherein to determine the data valid window the test data source is configured to generate a plurality of test data, the plurality of test data generated by both:
a test vector pattern generator; and
tapping application data transmitted to a reference integrated circuit provided within an application system in which an application task is performed.

23. The system of claim 21, wherein the system further comprises:
a test data source;
wherein to determine the data valid window the test data source is configured to generate a plurality of test data, the plurality of test data generated by tapping application data transmitted to a reference integrated circuit provided within an application system in which an application task is performed, wherein the application system comprises a motherboard.

24. The system of claim 21, wherein the system further comprises:
a test data source;
wherein to determine the data valid window the test data source is configured to generate a plurality of test data, the plurality of test data generated by a test vector pattern generator.

25. The system of claim 21, wherein the integrated circuit is a memory module.

26. The system of claim 21, wherein the integrated circuit is an ASIC.

27. The system of claim 21, wherein an operating parameters in the parameters at least one of temperature, voltage, frequency, and parameters associated with a motherboard.

28. A system for testing an integrated circuit, the system comprising:
a test environment for operating the integrated circuit, the test environment having:
a program memory for storing instructions;
a microprocessor for retrieving from the program memory, the microprocessor configured to:
instruct an operating parameter controller to apply the set of operating parameters to the test environment, and send a test data to a controller; and
the controller for converting the test data between a digital form and an electrical waveform;
wherein the system is configured to:
generate a plurality of sets of operating parameters;
for each of the plurality of sets of operating parameters:
apply the set of operating parameters to the test environment;
operate the integrated circuit in the test environment under the set of operating parameters;
generate a plurality of test data;
generate a first clock signal having a first frequency and a first phase;
generate a plurality of second clock signals, each of the plurality of second clock signals having the first frequency and one of a plurality of second phases;
for each of the plurality of test data and for each of the plurality of second clock signals:
transmit the respective test data and the first clock signal to the integrated circuit;
receive a data signal from the integrated circuit;

capture the data signal received from the integrated circuit in digital form by sampling the at least one data signal using the respective second clock signal of the plurality of second clock signals;

compare the data signal when captured in digital form with a reference pattern associated with the respective test data;

determine a result from the comparing, wherein the result is associated with both the respective test data and the respective second clock signal having one of the plurality of second phases; and identify a data valid window for the set of operating parameters for the integrated circuit from the said results determined for the plurality of test data and the plurality of second clock signals; and when the data valid windows have been identified for the plurality of sets of operating parameters, the data valid windows defining a set of identified data valid windows:

determine a solid operating timing window for the integrated circuit from the set of identified data valid windows, whereby the solid operating timing window is defined as a logical intersection of the data valid windows belonging in to the set of identified data valid windows such that the integrated circuit will return a valid sample and no solid operating timing window is defined where there is no logical intersection of the data valid windows belonging to the set of identified data valid windows.

29. The system of claim 28, wherein the system is further configured to:

determine a key timing index for the integrated circuit from the solid operating timing window, wherein the key timing index is determined by dividing the solid timing window by an ideal timing window and then multiplying by 100.

30. The system of claim 29, wherein the system is further configured to:

output a test outcome for the integrated circuit based on the key timing index.

31. The system of claim 30, wherein the system further comprises:

a test data source;

wherein to determine the data valid window the test data source is configured to generate a plurality of test data, the plurality of test data generated by both:

a test vector pattern generator; and tapping application data transmitted to a reference integrated circuit provided within an application system in which an application task is performed.

32. The system of claim 30, wherein the system further comprises:

a test data source;

wherein to determine the data valid window the test data source is configured to generate a plurality of test data, the plurality of test data generated by tapping application data transmitted to a reference integrated circuit provided within an application system in which an application task is performed, wherein the application system comprises a motherboard.

33. The system of claim 30, wherein the system further comprises:

a test data source;

wherein to determine the data valid window the test data source is configured to generate a plurality of test data, the plurality of test data generated by a test vector pattern generator.

34. The system of claim 30, wherein the integrated circuit is a memory module.

35. The system of claim 30, wherein the integrated circuit is an ASIC.

36. The system of claim 30, wherein an operating parameters of the set of operating parameters includes at least one of temperature, voltage, frequency, and parameters associated with a motherboard.

* * * * *

UNITED STATES PATENT AND TRADEMARK OFFICE
CERTIFICATE OF CORRECTION

| | | |
|---|---|---|
| PATENT NO. | : 9,003,256 B2 | Page 1 of 1 |
| APPLICATION NO. | : 13/605404 | |
| DATED | : April 7, 2015 | |
| INVENTOR(S) | : Lai et al. | |

It is certified that error appears in the above-identified patent and that said Letters Patent is hereby corrected as shown below:

On the title page item [57] should read

--Systems and methods are provided to determine a solid operating timing window for an integrated circuit device, and the solid operating timing window used to determine a key timing index. A method for determining the solid operating timing window is disclosed. A plurality of sets of operating parameters is generated. For each of the plurality of sets of operating parameters, the respective set of operating parameters is applied to a test environment. The integrated circuit is then operated under the applied respective set of operating parameters. A data valid window is determined for the integrated circuit. The solid operating timing window for the integrated circuit is then determined using the data valid windows for the plurality of sets of operating parameters, where the solid operating timing window is defined as the logical intersection of the determined data valid windows such that the integrated circuit will return a valid sample.--

In the claims

Column 13, Line 56, Claim 4, "generate" should read --generator--

Column 14, Line 56, Claim 10, "sample and" should read --sample; and--

Column 15, Lines 18 and 19, Claim 18, "parameters" should read --parameter--

Column 16, Lines 33 and 34, Claim 27, "parameters in the parameters" should read --parameter in the set of operating parameters includes--

Column 16, Line 42, Claim 28, insert --instructions-- after retrieving

Column 17, Line 24, Claim 28, delete "in"

Column 18, Lines 33 and 34, Claim 36, "parameters" should read --parameter--

Signed and Sealed this
Fifteenth Day of December, 2015

Michelle K. Lee
*Director of the United States Patent and Trademark Office*